(12) United States Patent
Isomoto

(10) Patent No.: US 7,957,143 B2
(45) Date of Patent: Jun. 7, 2011

(54) MOTOR CONTROLLER

(75) Inventor: Kenji Isomoto, Kitakyushu (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 56 days.

(21) Appl. No.: 12/440,059

(22) PCT Filed: Aug. 24, 2007

(86) PCT No.: PCT/JP2007/066418
§ 371 (c)(1),
(2), (4) Date: Mar. 5, 2009

(87) PCT Pub. No.: WO2008/029637
PCT Pub. Date: Mar. 13, 2008

(65) Prior Publication Data
US 2009/0268406 A1 Oct. 29, 2009

(30) Foreign Application Priority Data
Sep. 6, 2006 (JP) .................................. 2006-240950

(51) Int. Cl.
*H05K 7/20* (2006.01)
(52) U.S. Cl. ................... 361/697; 361/679.47; 361/707; 361/709; 361/719; 361/623; 165/80.3; 165/104.21; 363/141; 363/143; 363/144
(58) Field of Classification Search .......... 361/679.46–679.49, 679.52, 679.54, 361/688, 689, 690–697, 700–712, 715, 719, 361/720, 728, 736, 820; 165/80.2, 80.3, 165/80.4, 104.33, 104.34, 104.21; 257/706–727; 174/16.3, 252, 52.01; 454/184; 363/141, 143, 144
See application file for complete search history.

(56) References Cited

U.S. PATENT DOCUMENTS 4,769,557 A * 9/1988 Houf et al. ..................... 307/147
5,497,289 A * 3/1996 Sugishima et al. ............ 361/709
5,699,609 A * 12/1997 Wieloch .......................... 29/830

(Continued)

FOREIGN PATENT DOCUMENTS
JP    3-90449 U    9/1991
(Continued)

OTHER PUBLICATIONS
Chinese Office Action issued in Application No. 2007-80033034.9, dated Oct. 29, 2010.

*Primary Examiner* — Michael V Datskovskiy
(74) *Attorney, Agent, or Firm* — Sughrue Mion, PLLC

(57) ABSTRACT

A motor controller, which is inexpensive and has small size, is provided by reducing the size of a heat sink used in the motor controller and the number of all parts of the motor controller, wherein said motor controller includes a heat sink, a power semiconductor modules that is in close contact with the heat sink, a substrate (4) that is electrically connected to the power semiconductor module, and a fan (6) that generates the flow of external air and supplies cooling air to the heat sink, wherein said heat sink is formed by combining two kinds of heat sinks, which include a first heat sink (7) and a second heat sink (8), so as to conduct heat therebetween, and, wherein said power semiconductor module is in close contact with the second heat sink (8).

6 Claims, 4 Drawing Sheets

U.S. PATENT DOCUMENTS

| | | | | |
|---|---|---|---|---|
| 5,774,353 A * | 6/1998 | Wieloch | ................ | 363/146 |
| 5,909,358 A * | 6/1999 | Bradt | ................ | 361/707 |
| 6,087,800 A * | 7/2000 | Becker et al. | ................ | 318/778 |
| 6,091,604 A * | 7/2000 | Plougsgaard et al. | ........ | 361/707 |
| 6,249,435 B1 * | 6/2001 | Vicente et al. | ................ | 361/717 |
| 6,320,776 B1 * | 11/2001 | Kajiura et al. | ................ | 363/141 |
| 6,359,781 B1 * | 3/2002 | Hoss et al. | ............... | 361/679.46 |
| 6,477,053 B1 * | 11/2002 | Zeidan et al. | ................ | 361/719 |
| 6,493,227 B2 * | 12/2002 | Nielsen et al. | ................ | 361/703 |
| 6,621,700 B1 * | 9/2003 | Roman et al. | ................ | 361/697 |
| 6,862,182 B1 * | 3/2005 | Roman et al. | ................ | 361/697 |
| 6,870,737 B2 * | 3/2005 | Hashimoto et al. | ........... | 361/709 |
| 6,891,725 B2 * | 5/2005 | Derksen | ................ | 361/704 |
| 6,921,328 B1 * | 7/2005 | Nohara et al. | ................ | 454/184 |
| 6,970,356 B2 * | 11/2005 | Peng | ................ | 361/695 |
| 7,106,588 B2 * | 9/2006 | Oberlin et al. | ................ | 361/700 |
| 7,265,981 B2 * | 9/2007 | Lee | ................ | 361/707 |
| 7,265,985 B2 * | 9/2007 | Widmayer et al. | ............ | 361/721 |
| 7,679,886 B2 * | 3/2010 | Meier et al. | ................ | 361/623 |

FOREIGN PATENT DOCUMENTS

| | | |
|---|---|---|
| JP | 05-275582 A | 10/1993 |
| JP | 2004-319822 A | 11/2004 |
| JP | 2004-349548 A | 12/2004 |
| JP | 2005-223004 A | 8/2005 |

* cited by examiner (a)　　　　　　　(b)

(a)  (b)

MOTOR CONTROLLER

TECHNICAL FIELD

The present invention relates to a motor controller, such as an inverter device or a servo amplifier, which is generally operated by high-voltage power, and more particularly, to the structure where the size of a heat sink used in a motor controller is reduced and the number of all parts of a motor controller is reduced.

RELATED ART

A motor controller in the related art, for example, an inverter device is provided with a plurality of power semiconductor modules that are heat-generating parts, and a heat sink that cools the plurality of power semiconductor modules (for example, see Patent Document 1). Further, in order to reduce the number of all parts of the motor controller, it is effective to form the heat sink by die-casting that can form complicated shapes. Accordingly, die-casting has been generally used.

The motor controller in the related art, for example, an inverter device had had the structure shown in FIGS. 4 to 6.

In FIGS. 4 to 6, bosses 1a, engaging portions 1b, and fins 1c are formed at a heat sink 1. A substrate 4 is placed on the bosses 1a, and fixed to the heat sink 1 by screws 5. A power semiconductor module 2 is disposed on the heat sink 1, that is, on the lower surface of the substrate 4. Meanwhile, the power semiconductor module 2 is fixed to the upper surface of the heat sink 1 by screws 3 so as to be in close contact with the upper surface of the heat sink. Further, a fan 6 is fixed to the engaging portions 1b, so that the cooling efficiency of the heat sink 1 is improved by supplying cooling air to the fins 1c.

In this structure, the heat sink 1 is manufactured by die-casting and includes the bosses 1a for fixing the substrate 4 and the engaging portions 1b for fixing the fan 6, so that the number of all parts is reduced.

Patent Document 1: JP-A-2004-349548

DISCLOSURE OF THE INVENTION

Problems to be solved by the Invention

However, the heat sink of the motor controller in the related art has had the following problem.

That is, die-casting causes thermal conductivity to deteriorate and cannot make the pitch of fins too small. For this reason, cooling efficiency deteriorates and the size of the heat sink is not reduced. Accordingly, there has been limit on reducing the size of the motor controller by reducing the size of the heat sink.

The invention has been made to solve the above-mentioned problem, and provides a motor controller that can easily reduce the size and manufacturing cost of a motor controller by reducing the size of a heat sink without increasing the number of parts.

Means for Solving the Problems

In order to solve the above-mentioned problem, the invention has the following structure.

According to the invention of claim 1, there is provided a motor controller including:
a heat sink,
a plurality of power semiconductor modules that is in close contact with the heat sink,
a substrate that is electrically connected to the plurality of power semiconductor modules, and
a fan that generates the flow of external air and supplies cooling air to the heat sink, characterized in that
the heat sink is formed by combining two kinds of heat sinks, which include a first heat sink and a second heat sink, so as to conduct heat therebetween, and
the power semiconductor modules are in close contact with the second heat sink.

According to the invention of claim 2, there is provided the motor controller, characterized in that
the first heat sink is a die-cast heat sink, and
the second heat sink is made of a material having excellent thermal conductivity by an extruding or caulking method.

According to the invention of claim 3, there is provided the motor controller, characterized in that
at least one heat sink of the first and second heat sinks includes fins.

According to the invention of claim 4, there is provided the motor controller, characterized in that
the first and second heat sinks include fins, and
the fins of the first heat sink are disposed upwind as compared to the fins of the second heat sink.

According to the invention of claim 5, there is provided the motor controller, characterized in that
the pitch of the fins of the second heat sink is smaller than that of the fins of the first heat sink.

According to the invention of claim 6, there is provided the motor controller, characterized in that
the first and second heat sinks are in close contact with each other so as to conduct heat therebetween.

According to the invention of claim 7, there is provided the motor controller, characterized in that
the first and second heat sinks are connected to each other by a heat pipe so as to conduct heat therebetween.

EFFECTS OF THE INVENTION

According to the inventions, it is possible to obtain the following effects.

According to the inventions of claims 1, 2 and 3, the heat sink is formed by the combination of two kinds of heat sinks that include the first heat sink and the second heat sink, and the first heat sink is a die-cast heat sink that can be formed to have complicated shapes. Therefore, it is possible to easily form the bosses for fixing the substrate and the engaging portions for fixing the fan, so that the number of parts of the motor controller is reduced.

Further, the second heat sink is formed of a heat sink that has excellent thermal conductivity and is formed by an extruding or caulking method, so that it is possible to improve cooling efficiency, to reduce the size of the heat sink, and to reduce the size of the motor controller.

Furthermore, the first and second heat sinks are combined with each other so that heat can be conducted therebetween. Accordingly, a part of the heat of the second heat sink of which the temperature is high can be conducted to the first heat sink, and the first heat sink can also radiate the heat of the power semiconductor module that is in close contact with the second heat sink. As a result, it is possible to improve cooling efficiency.

According to the invention of claim 4, the fins of the second heat sink of which the temperature easily becomes high due to good transfer of heat of the power semiconductor module having excellent thermal conductivity are disposed downwind as compared to the fins of the first heat sink. Therefore, the first heat sink is not affected by the second heat sink of which the temperature is high.

According to the invention of claim 5, the pitch of the fins of the second heat sink such as a caulk having excellent thermal conductivity is smaller than the pitch of fins that can be manufactured by die-casting. Therefore, the heat radiating area is increased, so that cooling efficiency is improved. As a result, it is possible to reduce the size of the heat sink, and to reduce the size of the motor controller.

According to the invention of claim 6, since the first and second heat sinks may be in close contact with each other so as to conduct heat therebetween, it is possible to effectively improve the heat radiating effect of each of two heat sinks. Therefore, it is possible to efficiently reduce the size of the heat sink and the size of the motor controller.

According to the invention of claim 7, since the first and second heat sinks may be connected to each other by a heat pipe so as to conduct heat therebetween, it is possible to more effectively improve the heat radiating effect of each of two heat sinks. Therefore, it is possible to further reduce the size of the heat sink and the size of the motor controller.

BRIEF DESCRIPTION OF THE DRAWINGS

FIG. 3 is a view showing the motor controller shown in FIG. 2, wherein FIG. 3(a) is a right side view and FIG. 3(b) is a rear view.

FIG. 6 is a view showing the motor controller shown in FIG. 5, wherein FIG. 6(a) is a right side view and FIG. 6(b) is a rear view.

DESCRIPTION OF REFERENCE NUMERALS AND SIGNS

1: HEAT SINK
1a: BOSS
1b: ENGAGING PORTION
1c: FIN
2: POWER SEMICONDUCTOR MODULE
3: SCREW FOR FIXING POWER SEMICONDUCTOR MODULE
4: SUBSTRATE
5: SCREW FOR FIXING SUBSTRATE
6: FAN
7: FIRST HEAT SINK
7a: BOSS
7b: ENGAGING PORTION
7c: HOLLOW HOLE
8: SECOND HEAT SINK
8a: FIN
9: SCREW FOR FIXING SECOND HEAT SINK
10: HEAT PIPE

BEST MODE FOR CARRYING OUT THE INVENTION

Embodiments of the invention will be described below with reference to drawings.

First Embodiment

Figure 1:
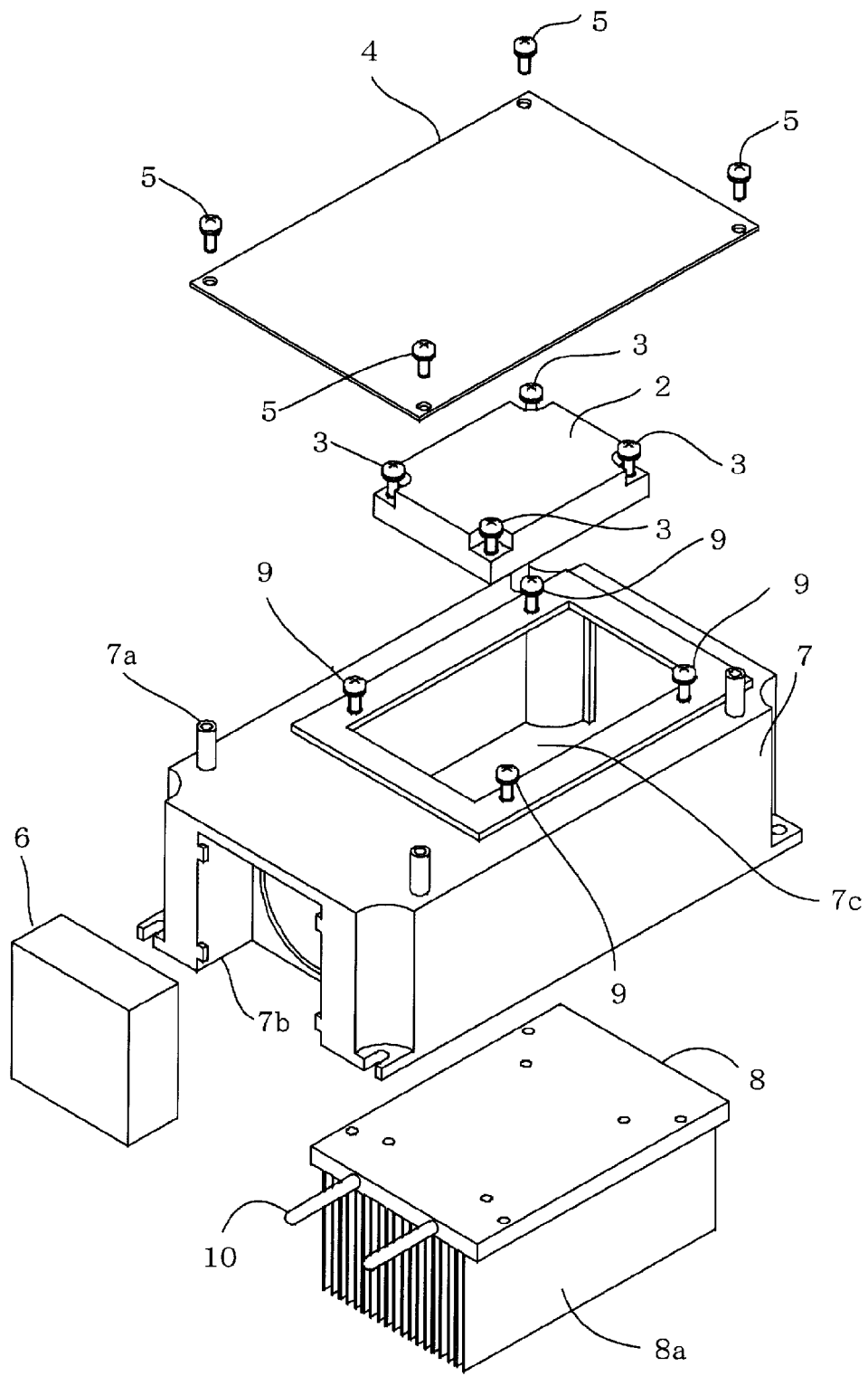
FIG. 1 is an exploded perspective view of a motor controller according to a first embodiment of the invention.

FIG. 1 is an exploded perspective view of a motor controller according to a first embodiment of the invention.

Figure 2:
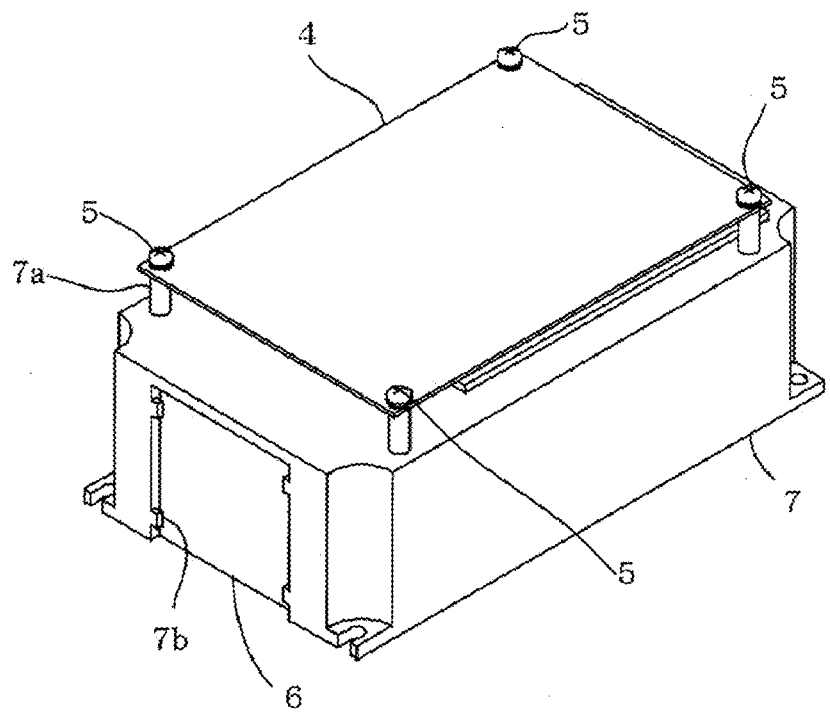
FIG. 2 is an assembled perspective view of the motor controller shown in FIG. 1.
Figure 3:
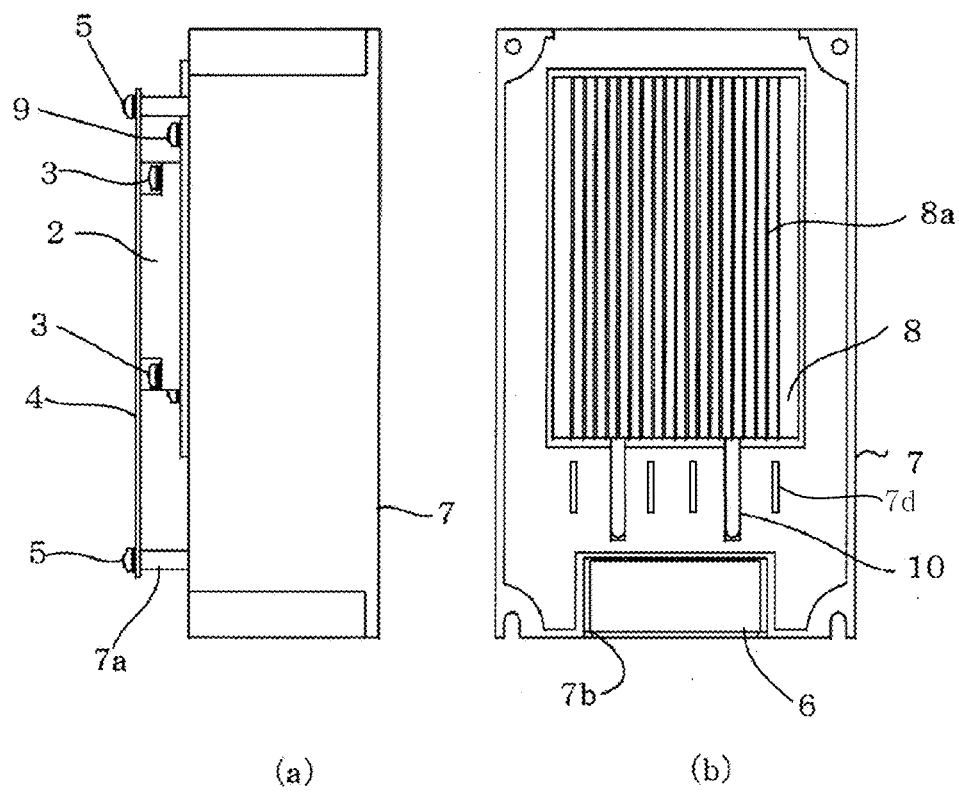
Figure 4:
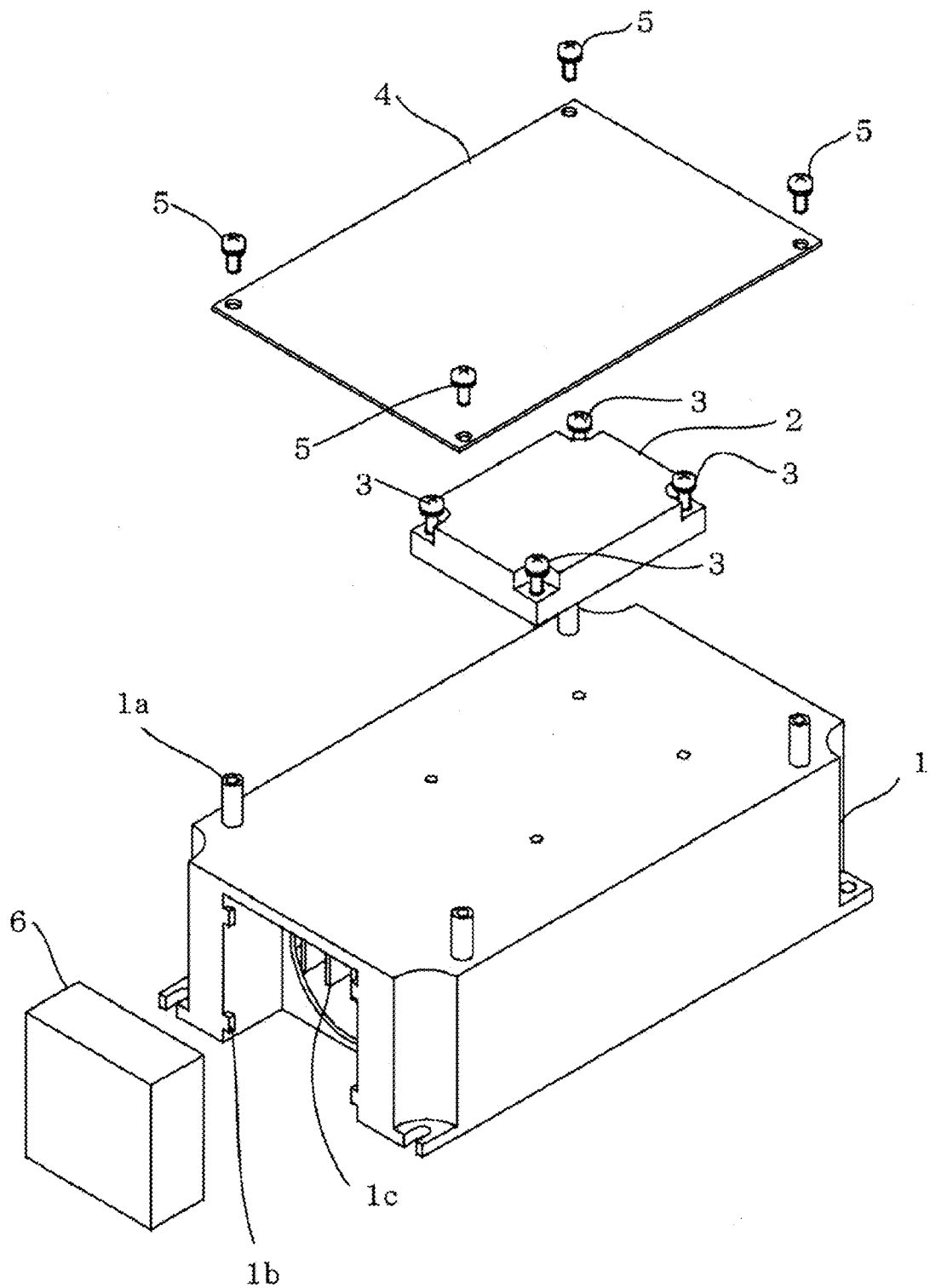
FIG. 4 is an exploded perspective view of a motor controller in the related art.
Figure 5:
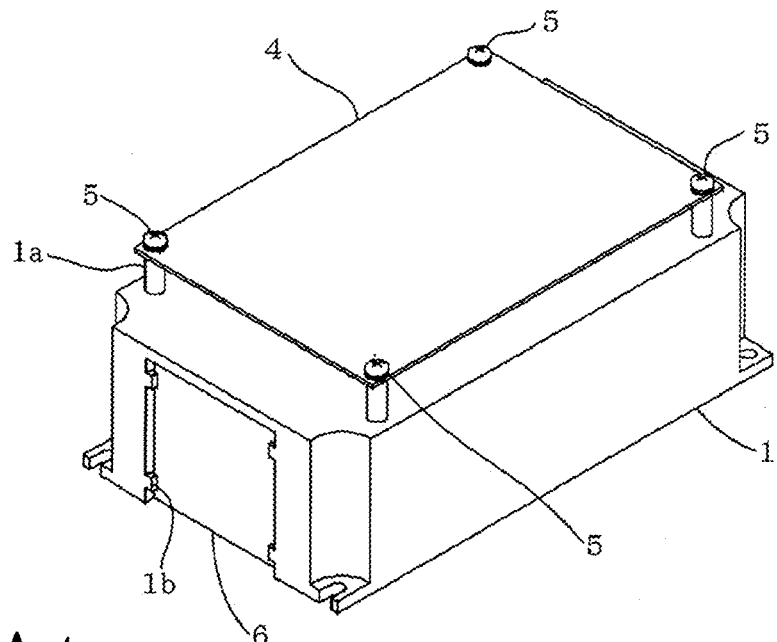
FIG. 5 is an assembled perspective view of the motor controller shown in FIG. 4.
Figure 6:
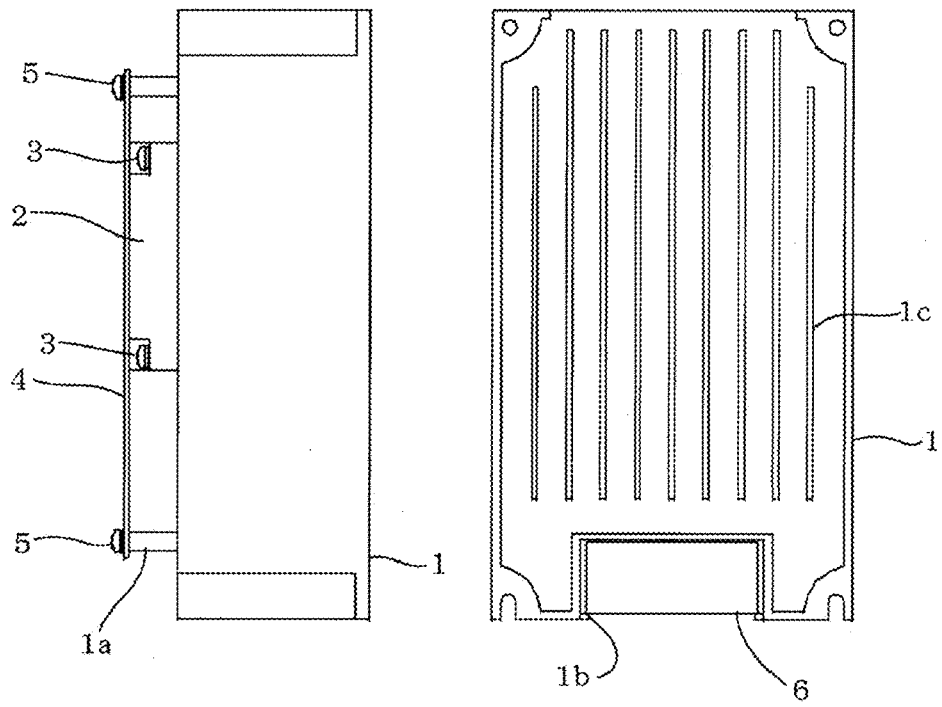

FIG. 2 is an assembled perspective view of the motor controller shown in FIG. 1. FIG. 3 is a view showing the motor controller shown in FIG. 2, wherein FIG. 3(a) is a right side view and FIG. 3(b) is a rear view.

In FIGS. 1 to 3, reference numeral 2 denotes a power semiconductor module, reference numeral 4 denotes a substrate, reference numeral 6 denotes a fan, reference numeral 7 denotes a first heat sink, reference numeral 8 denotes a second heat sink, and reference numeral 10 denotes a heat pipe.

Bosses 7a, engaging portions 7b, and a hollow hole 7c are formed at the first heat sink 7. The substrate 4 is placed on the bosses 7a, and fixed to the first heat sink 7 by screws 5. The power semiconductor module 2 is disposed on the first heat sink 7, that is, on the lower surface of the substrate 4, and fixed to the upper surface of the first heat sink 7 by screws 3 so as to be in close contact with the upper surface of the first heat sink. The second heat sink 8 is disposed at a position corresponding to the hollow hole 7c of the first heat sink 7, and fixed to the first heat sink 7 by screws 9. The first and second heat sinks 7 and 8 are connected to each other by the heat pipe 10. Further, the second heat sink 8 is provided with fins 8a, and a fan 6 is fixed to the engaging portions 7b of the first heat sink 7. Accordingly, the cooling efficiency of the second heat sink 8 is improved by supplying cooling air to the fins 8c.

In this case, if a space required for providing fins is formed at the first heat sink 7, fins 7d are provided at the first heat sink 7 and the cooling efficiency of the first heat sink 7 may be improved by supplying cooling air, which is generated by the fan 6, to the fins 7d. In this case, fins 8a of the second heat sink 8 of which the temperature easily becomes high due to good transfer of heat of the power semiconductor module 2 having excellent thermal conductivity are disposed downwind as compared to fins of the first heat sink 7. Accordingly, there is no deterioration of cooling performance of the first heat sink 7 that is caused by the influence of high-temperature air.

In this structure, the first heat sink 7 is manufactured by die-casting and includes the bosses 7a for fixing the substrate 4 and the engaging portions 7b for fixing the fan 6, so that it is possible to reduce the number of all parts of the motor controller.

Further, a heat sink such as a caulk having excellent thermal conductivity is used as the second heat sink 8, and the pitch of the fins 8a is smaller than the pitch of fins that can be manufactured by die-casting. Accordingly, the heat radiating area of the second heat sink 8 is increased, so that cooling efficiency is improved. As a result, it is possible to reduce the size of the second heat sink 8.

In addition, since a part of the cooling performance of the second heat sink 8 can be transmitted to the first heat sink 7 by the heat pipe 10, it is possible to further reduce the size of the second heat sink. As a result, it is possible to reduce the size of the motor controller.

Meanwhile, in the invention, it may be possible to combine two kinds of heat sinks so as to conduct heat therebetween by making the first and second heat sinks 7 and 8 be in close contact with each other without using a heat pipe. Even in this case, it is possible to effectively improve the heat radiating effect of each of two heat sinks. Therefore, it is possible to efficiently reduce the size of the heat sink and the size of the motor controller.

INDUSTRIAL APPLICABILITY

The invention relates to a motor controller, such as an inverter device or a servo amplifier, which is generally operated by high-voltage power, and more particularly, to the structure where the size of a heat sink used in a motor controller is reduced and the number of all parts of a motor controller is reduced. The invention may be used in a field related to the manufacture and provision of a motor controller that can easily reduce the size and manufacturing cost of a motor controller by reducing the size of a heat sink without increasing the number of parts much.

The invention claimed is:

1. A motor controller comprising:
   a heat sink,
   a power semiconductor module that is in close contact with the heat sink,
   a substrate that is electrically connected to the power semiconductor module, and
   a fan that generates the flow of external air and supplies cooling air to the heat sink, wherein
   the heat sink is formed by combining two kinds of heat sinks, which include a first heat sink and a second heat sink, so as to conduct heat therebetween, and
   the power semiconductor module is in close contact with the second heat sink wherein
   the first heat sink is a die-cast heat sink, and
   the second heat sink is made of a material having excellent thermal conductivity by an extruding or caulking method.

2. The motor controller according to claim 1, wherein at least one heat sink of the first and second heat sinks includes fins.

3. The motor controller according to claim 2, wherein the first and second heat sinks include fins, and the fins of the first heat sink are disposed upwind as compared to the fins of the second heat sink.

4. The motor controller according to claim 3, wherein the pitch of the fins of the second heat sink is smaller than that of the fins of the first heat sink.

5. The motor controller according to claim 1, wherein the first and second heat sinks are in close contact with each other so as to conduct heat therebetween.

6. The motor controller according to claim 1, wherein the first and second heat sinks are connected to each other by a heat pipe so as to conduct heat therebetween.

* * * * *